US007080226B1

(12) United States Patent
Patterson

(10) Patent No.: US 7,080,226 B1
(45) Date of Patent: Jul. 18, 2006

(54) FIELD PROGRAMMABLE GATE ARRAY (FPGA) CONFIGURATION DATA PATH FOR MODULE COMMUNICATION

(75) Inventor: Cameron D. Patterson, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 379 days.

(21) Appl. No.: 10/612,522

(22) Filed: Jul. 2, 2003

(51) Int. Cl.
*G06F 12/00* (2006.01)
(52) U.S. Cl. ................. 711/165; 711/103; 711/149; 711/163; 326/38; 326/39; 326/40; 326/41
(58) Field of Classification Search ............... 711/165, 711/103, 149, 163; 326/38, 39, 40, 41
See application file for complete search history.

(56) References Cited

U.S. PATENT DOCUMENTS

| | | | | |
|---|---|---|---|---|
| 6,096,091 | A * | 8/2000 | Hartmann | 716/17 |
| 6,204,687 | B1 * | 3/2001 | Schultz et al. | 326/40 |
| 6,255,848 | B1 * | 7/2001 | Schultz et al. | 326/41 |
| 6,907,595 | B1 * | 6/2005 | Curd et al. | 716/16 |
| 6,920,627 | B1 * | 7/2005 | Blodget et al. | 716/17 |

OTHER PUBLICATIONS

U.S. Appl. No. 10/319,051, filed Dec. 13, 2002, Curd et al.
U.S. Appl. No. 10/377,857, filed Feb. 28, 2003, Blodgett et al.
T. Marescaux et al., "Interconnection Networks Enable Fine-Grain Dynamic Multi-Tasking on FPGA's," IMEC vzw., Kapeldreef 75, 3001 Leuven, Belgium, available from marescau@imec.be, pp 795-805, Sep. 4, 2002, "www.imec.be/reconfigurable/pdf/FPL_02_interconnection.pdf".
William J. Dally et al.; "Route Packets, Not Wires: On-Chip Interconnection Networks," Computer Systems Laboratory, pp. 1-6, Available from Stanford University, Stanford, CA 94305, [billd,btowles]@cva.stanford.edu, Jun. 22, 2001.
Xilinx, Inc., "Virtex Series Configuration Architecture User Guide," XAPP151, Mar. 24, 2003, pp. 1-45, (v1.6), available from Xilinx, Inc. 2100 Logic Drive, San Jose, CA 95124.

* cited by examiner

*Primary Examiner*—Stephen C. Elmore

(57) ABSTRACT

Data is transferred on a field programmable gate array (FPGA) by (1) retrieving a first set of data from a first block RAM column of a configuration memory of the FPGA, (2) storing the first set of data retrieved from the first block RAM column in a frame data output register, (3) transferring the first set of data from the frame data output register directly to a frame data input register through a configuration bus of the FPGA, and (4) transferring the first set of data from the frame data input register to a second block RAM column of the configuration memory. The configuration bus is wide (e.g., 32-bits), thereby resulting in a high data transfer bandwidth.

21 Claims, 5 Drawing Sheets

FIELD PROGRAMMABLE GATE ARRAY (FPGA) CONFIGURATION DATA PATH FOR MODULE COMMUNICATION

FIELD OF THE INVENTION

The present invention relates to programmable logic devices, such as field programmable gate arrays (FPGAs). More specifically, the present invention relates to the use of an FPGA configuration data path to enable communication between modules of the FPGA.

RELATED ART

A variety of structures have been proposed for block data communication between dynamic tasks, such as point-to-point connections, buses and networks. These structures can be efficiently implemented in an application specific integrated circuit (ASIC); however, FPGA implementations can have speed, resource and power penalties.

FIG. 1 is a block diagram of a conventional FPGA 100, such as the Virtex-II™ series FPGAs commonly available from Xilinx, Inc., 2100 Logic Drive, San Jose, Calif. 95124. FPGA 100 includes sets of input/output blocks (IOBs) 101–104 located around the perimeter of the FPGA, an array of configurable logic blocks (CLBs) 110–111, at least two columns of block random access memory (RAM) 120–121, configuration logic 130, and internal configuration access port (ICAP) module 140. FPGA 100 also includes other elements, such as a programmable interconnect structure and a configuration memory, which are not illustrated in FIG. 1. Configuration data values are loaded into the configuration memory via configuration logic 130, which includes a configuration bus. One embodiment of configuration architecture of FPGA 100 is described in more detail in "Virtex™ Series Configuration Architecture User Guide," XAPP151 (v1.6), Mar. 24, 2003, available from Xilinx, Inc., 2100 Logic Drive, San Jose, Calif. 95124.

In general, FPGA 100 is configured in response to a set of configuration data values, which are loaded into the configuration memory of FPGA 100 (not shown), via configuration logic 130. One column of the configuration memory is used to implement block RAM column 120, and another column of the configuration memory is used to implement block RAM column 121. Although only two block RAM columns are illustrated in FIG. 1, it is understood that other numbers of block RAM columns can be present on FPGA 100.

ICAP module 140 is the fundamental module to perform in-circuit reconfiguration in the Virtex-II™ and Virtex-II™ Pro FPGAs. ICAP module 140 can be used to access the device configuration registers, as well as to transfer data stored in the configuration memory (including data values stored in block RAM columns 120–121). Thus, the contents of block RAM columns 120 and 121 can be read and written through ICAP module 140. These read and write operations provide an alternative to using the programmable interconnect structure (i.e., the configurable routing resources) of FPGA 100 for transferring data between block RAM columns that are allocated to communicating tasks. In such operations, the contents of each block RAM column (e.g., a block RAM frame) must be read through ICAP module 140 into a buffer (not shown in FIG. 1). The block RAM frame stored in the buffer is then written back through ICAP module 140 to the destination block RAM column. In Virtex-II™ FPGAs, the data interface within ICAP module 140 is 8-bits wide. The maximum clock frequency of ICAP module 140 is 60 MHz, thereby limiting the data bandwidth of ICAP module 140 to 60 MB/sec. This creates a bottleneck for transfers between block RAM columns.

As illustrated in FIG. 2, the following sequence of operations must be performed in order to read a block RAM column. First, the address of the source block RAM (e.g., block RAM column 120) must be written to a frame address register (FAR) 201. A read configuration instruction (RCFG) is then sent to a command register (CMD) 202 to set FPGA 100 for readback. The contents of frame address register 201 and command register 202 are provided to a configuration state machine 131 within configuration logic 130. An instruction that specifies the number of 32-bit words to be read from a frame data output register (FDRO) 203 within configuration logic 130 is then sent to configuration state machine 131. The instruction pipeline of configuration logic 130 is flushed, and the contents of the source block RAM column 120 are transferred to the frame data output register 203 on a bus having a width N, where N is the width of the block RAM frame. The block RAM frame is transferred from frame data output register 203 to ICAP module 140 as a plurality of 32-bit data bytes on the 32-bit wide configuration data bus. ICAP module 140 converts these 32-bit data bytes to 8-bit data bytes, which are stored in buffer 204.

As illustrated in FIG. 3, the following sequence of operations must be performed in order to transfer the data words to the destination block RAM column (e.g., the block RAM frame is retrieved from buffer 204 by ICAP module 140, and is written to the destination block RAM column). First, the address of the destination block RAM column (e.g., block RAM column 121) is written to frame address register 201. A write configuration instruction (WCFG) is then sent to command register 202. An instruction that specifies the number of 32-bit words to be written to a frame data input register (FDRI) 205 within configuration logic 130 is then sent to configuration state machine 131. ICAP module 140 then retrieves the 8-bit data bytes from buffer 204, and provides 32-bit data bytes to the configuration data bus. The 32-bit data bytes are latched into frame data input register 205. After the block RAM frame has been latched in frame data input register 205, the block RAM frame is written from frame data input register 205 to destination block RAM column 121 on a bus having a width N, where N is the width of configuration logic 130 is then flushed.

The above-described transfer is a lengthy process. For example, if block RAM column 120 has a data storage capacity of 432 kBits, then copying the contents of block RAM column 120 to block RAM 121 in this way would require over 108,000 read and write operations to be performed by ICAP module 140.

The ability to copy data between any block RAM columns without the use of general routing is very useful. Other schemes use the general routing (i.e., the configurable routing resources) of the FPGA to transfer data between block RAM columns; however, such schemes typically consume a large amount of FPGA resources. One example of such a scheme in which a dynamic partial reconfiguration environment is implemented using a Virtex-II™ FPGA is described in an IMEC article by T. Marescaux et al., entitled "Interconnection Networks Enable Fine-Grain Dynamic Multi-Tasking on FPGAs.". However, it can be difficult to provide high bandwidth data transfers between modules that are not adjacent in a dynamic partial reconfiguration environment. For example, IMEC's on-chip network transfers packets between the block RAM buffers of each task. These inter-task signals must pass through tri-state buffers in the partial reconfiguration flow; however, tri-state resources may be limited. For instance, there are only two tri-state buffers available per CLB row in Virtex-II™ and Virtex-II™ Pro FPGAS, and the maximum bandwidth is only 80 MB/sec, partly due to restrictions on the number of inter-task signals. For FPGA architectures that do not include tri-State buffers, other mechanisms must be developed to transfer data between dynamic modules.

It would therefore be desirable to have a method and apparatus for enabling high-speed communication between modules, such as block RAMs, on a FPGA. It would further be desirable if this method and apparatus exploits the unique capabilities and existing hardwired circuitry of the FPGA, thereby reducing the requirement for additional circuitry on the FPGA.

Accordingly, the present invention eliminates a bottleneck introduced by the ICAP module for data transfers between two block RAM columns by adding new configuration commands that transfer data directly from the source block RAM column to the destination block RAM column, via the configuration data bus of the FPGA. By avoiding the reading and writing of data through the ICAP module, data transfers can be fully pipelined and can use the full width of the configuration data bus. The configuration data bus width (e.g., 32-bits) is greater than the internal data width of the ICAP module (e.g., 8-bits). This can increase the transfer speed by at least one order of magnitude.

In accordance with one embodiment, data is transferred on a field programmable gate array (FPGA) by (1) retrieving a first set of data from a first block RAM column of a configuration memory of the FPGA, (2) storing the first set of data retrieved from the first block RAM column in a frame data output register, (3) transferring the first set of data from the frame data output register directly to a frame data input register through a configuration bus of the FPGA, and (4) transferring the first set of data from the frame data input register to a second block RAM column of the configuration memory. The wide configuration bus results in a high data transfer bandwidth.

In accordance with one embodiment, the step of retrieving the first set of data comprises retrieving all of the first set of data from the first block RAM column in parallel. The step of transferring the first set of data from the first storage element to the second storage element can then include shifting the first set of data onto the configuration bus as a plurality of data words. In another variation, one or more sections of the second block RAM column can be write protected.

The present invention can be implemented by loading an address associated with the first block RAM column into a source frame address register, loading a second address associated with the second block RAM column into a destination frame address register, and loading a copy configuration instruction specifying a data transfer into a command register. A configuration state machine coupled to the source frame address register, destination frame address register and command register, controls the data transfer.

The present invention will be more fully understood in view of the following description and drawings.

DETAILED DESCRIPTION

Figure 1:
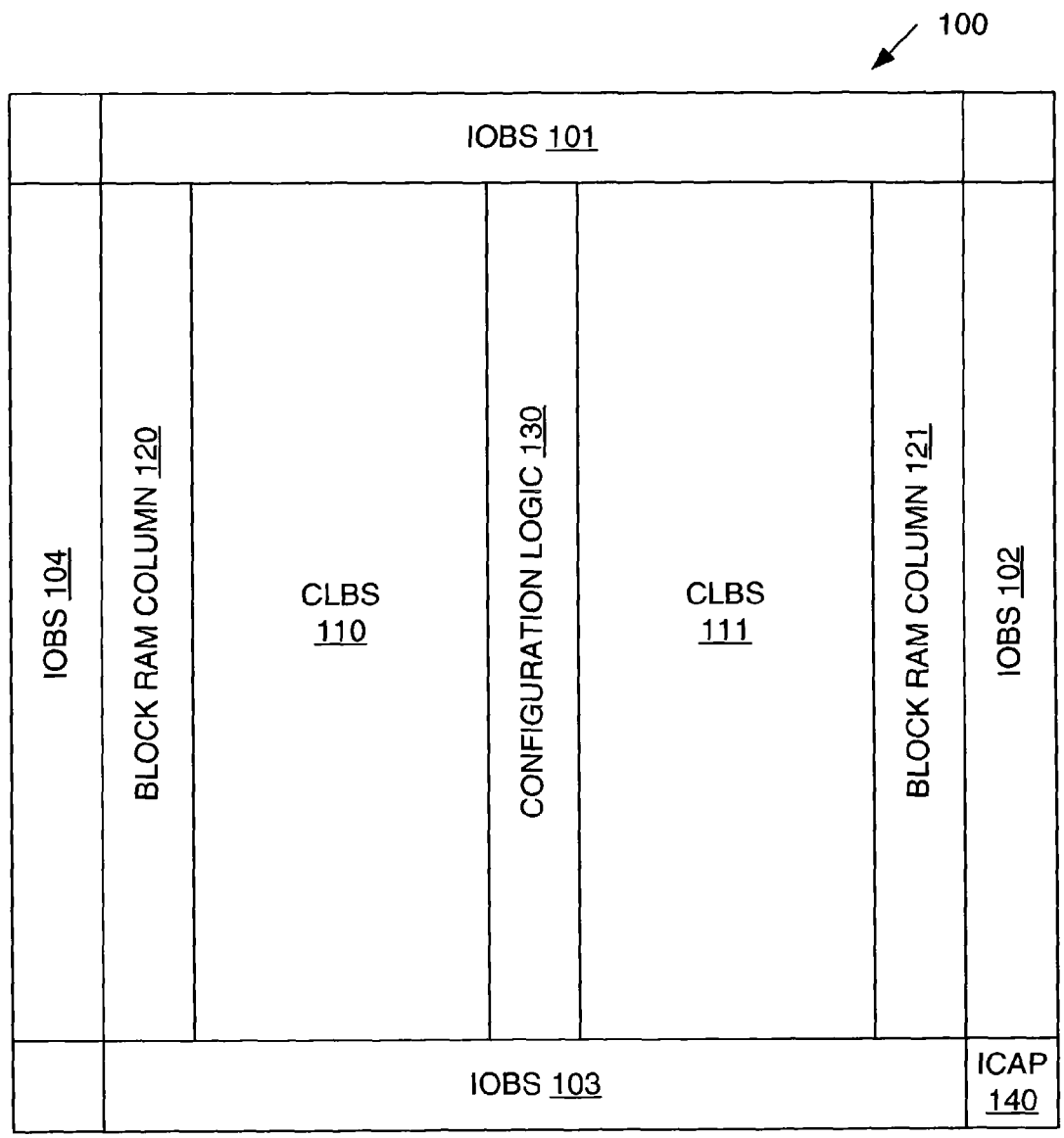
FIG. 1 is a block diagram of a conventional FPGA.
Figure 2:
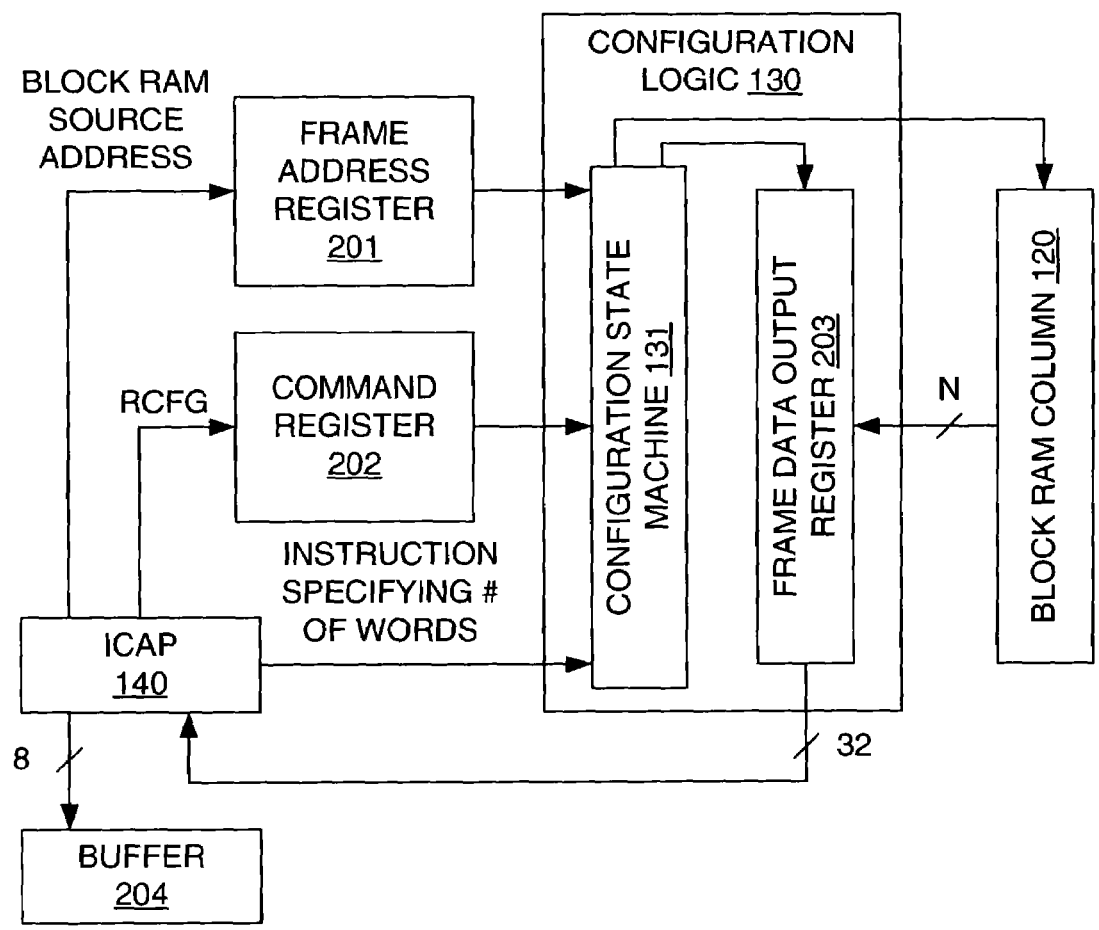
FIG. 2 is a block diagram illustrating a read portion of a conventional data transfer between the block RAMs of the FPGA of FIG. 1.
Figure 3:
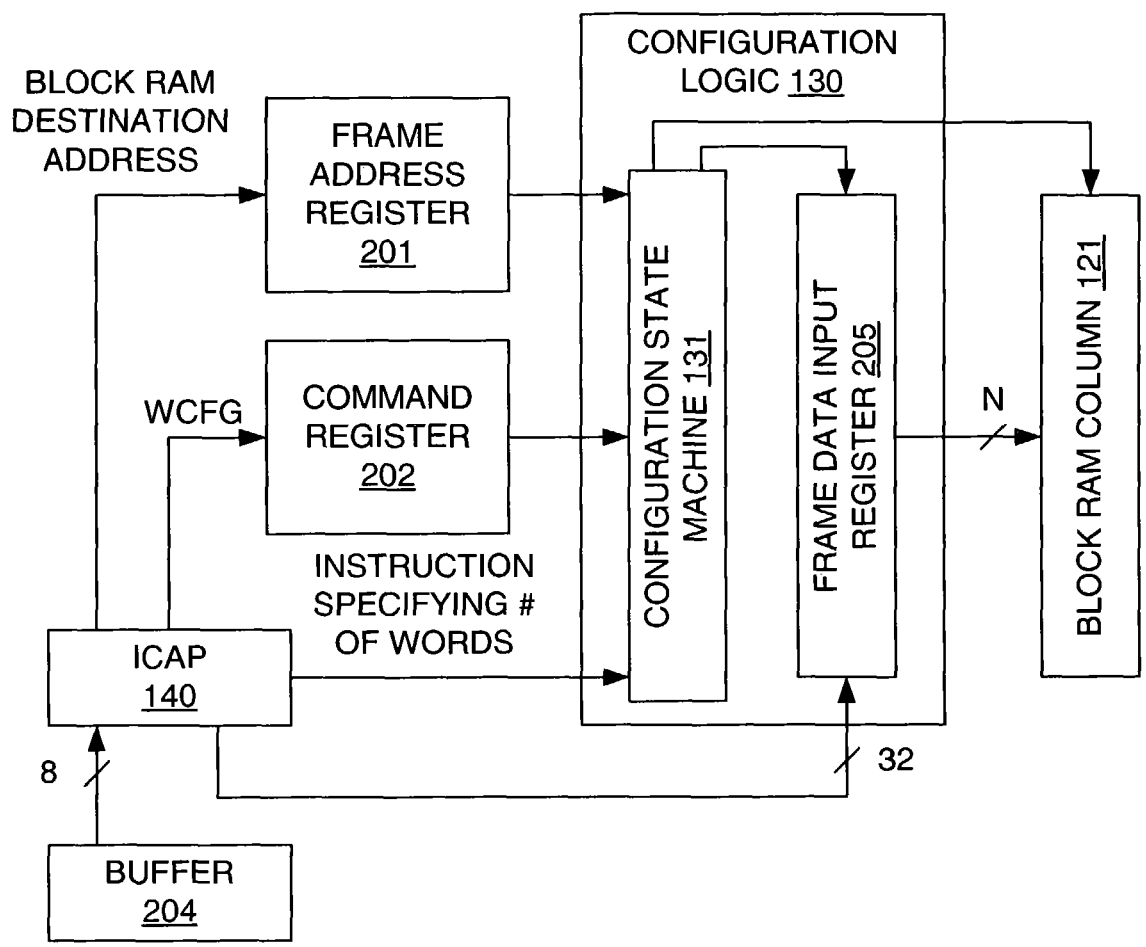
FIG. 3 is a block diagram illustrating a write portion of a conventional data transfer between the block RAMs of the FPGA of FIG. 1.
Figure 4:
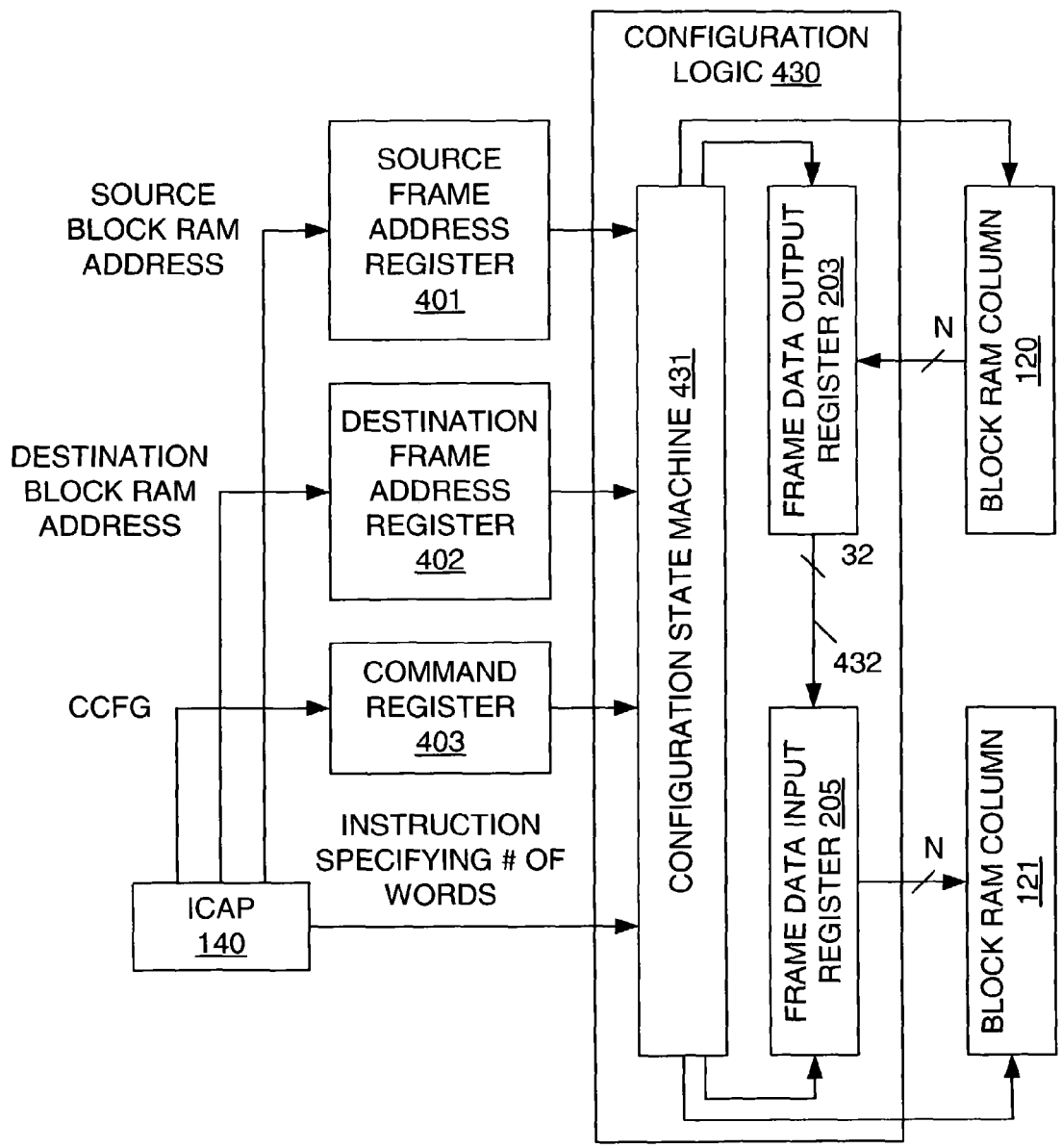
FIG. 4 is a block diagram of a data transfer system of an FPGA in accordance with one embodiment of the present invention.

FIG. 4 is a block diagram of a data transfer system 400 of an FPGA in accordance with one embodiment of the present invention. Data transfer system 400 is located on an FPGA similar to FPGA 100 (FIG. 1). Thus, similar elements in FIGS. 1 and 4 are labeled with the same or similar reference numbers. Data transfer system 400 includes source frame address register 401, destination frame address register 402, command register 403, configuration logic 430 (which includes frame data output register 203, frame data input register 205, configuration state machine 431 and 32-bit configuration bus 432), block RAM columns 120–121 and ICAP module 140. Data transfer system 400 is capable of directly transferring data from block RAM column 120 to block RAM column 121 (or vice versa) over the 32-bit configuration bus 432. Although the present invention is described in connection with two block RAM columns 120–121, it is understood that the present invention can be applied to an FPGA having more than two block RAM columns. Note that typically, initial sets of data can be loaded into the block RAM columns via configuration bus 432. This can occur, for instance, during the initial configuration of an FPGA.

The sequence used to copy a block RAM column in accordance with the present invention is described below. First, the address of the source block RAM column (e.g., block RAM column 120) is written to source frame address register 401. The address of the destination block RAM column (e.g., block RAM column 121) is written to destination frame address register 402. The addresses of the source and destination block RAM columns are provided from source frame address register 401 and destination frame address register 402 to configuration state machine 431. Configuration state machine 431 includes all of the functionality of a conventional configuration state machine, plus the additional functionality described below. A copy configuration instruction (CCFG) is then sent to the command register 403. The command register 403 provides the CCFG instruction to configuration state machine 431. An instruction that specifies the number of 32-bits words to be copied is then sent from ICAP module 140 to configuration state machine 431. The instruction pipeline of configuration logic 430 is then flushed.

As a result, configuration state machine 431 causes the addressed column of source block RAM column 120 to be read out into frame data output register 203 on a bus having a width N, where N is equal to the width of block RAM column 120. That is, all of the contents of block RAM column 120 are transferred to frame data output register 203 in parallel. Configuration state machine 431 then causes the contents of frame data output register 203 to be sequentially provided to 32-bit wide configuration data bus 432, as a plurality of 32-bit data bytes. Configuration state machine 431 further causes the 32-bit data words on configuration data bus 432 to be written sequentially to frame data input register 205.

When frame data input register 205 is full, configuration state machine 431 causes the contents of frame data input register to be written to destination block RAM column 121 on a bus having a width N, where N is equal to the width of block RAM column 121. That is, all of the contents frame data input register 205 are transferred to block RAM column 121 in parallel.

In accordance with one embodiment, source frame address register 401, destination frame address register 402 and the CCFG instruction are added to an existing configuration architecture for an FPGA, such as the Virtex-II™ or Virtex-II™ Pro series FPGAs.

Advantageously, the present invention only requires a small number of changes to the configuration architecture of a conventional FPGA 100, and does not impact the logic and routing structure of the FPGA. Note that the present invention uses ICAP module 140 only to send configuration instructions, and that the block RAM column data no longer transfers in or out of ICAP module 140. As described above, ICAP module 140 is only 8-bits wide, but the internal configuration bus 432 is 32-bits wide. There is a significant speed and power advantage when data does not have to be both read and written through ICAP module 140. For example, the data transfer rate of the described embodiment is at least about 500 Mbytes/second.

In accordance with another embodiment, data can also be transferred between columns of look-up table (LUT) RAMs of the FPGA. This is possible because both the block RAMs and the LUT RAMs are both part of the same configuration memory on the FPGA. Thus, to transfer data between columns of LUT RAMs, the address of the source LUT RAM is loaded into source frame address register 401, the address of the destination LUT RAM is loaded into destination frame address register 402, and the CCFG command is provided to command register 403, and an instruction specifying the number of words in the transfer is provided to configuration state machine. Note that the data transfer bandwidth for LUT RAM transfers may be less than the bandwidth for block RAM transfers when there are fewer LUT RAM data values than block RAM data values in a column of the configuration memory. In general, any portion of the configuration memory of an FPGA can be transferred to any other portion of the configuration memory in accordance with the present invention.

In accordance with another embodiment, a process or operating system service internal or external to the FPGA is responsible for transferring large blocks of data between communicating tasks. More specifically, the communicating tasks indicate the source and destination block RAM columns to the transfer process or operating system service. The transfer process or operating system service can then implement the data transfer between block RAM columns in the manner described above. The transfer process or operating system service would then provide a completion signal or message to the communicating tasks.

The applicability of the present invention is quite broad. For example, the invention can be applied in any situation where it is desirable to transfer the contents of one block RAM column to one or more other block RAM columns without the need for explicit user routing. This transfer can be deployed for testing the FPGA or during operation of the user design on the FPGA.

Moreover, although a full data transfer between block RAM columns 120 and 121 is described, it is understood that a partial data transfer between these block RAM columns can also be performed.

Figure 5:
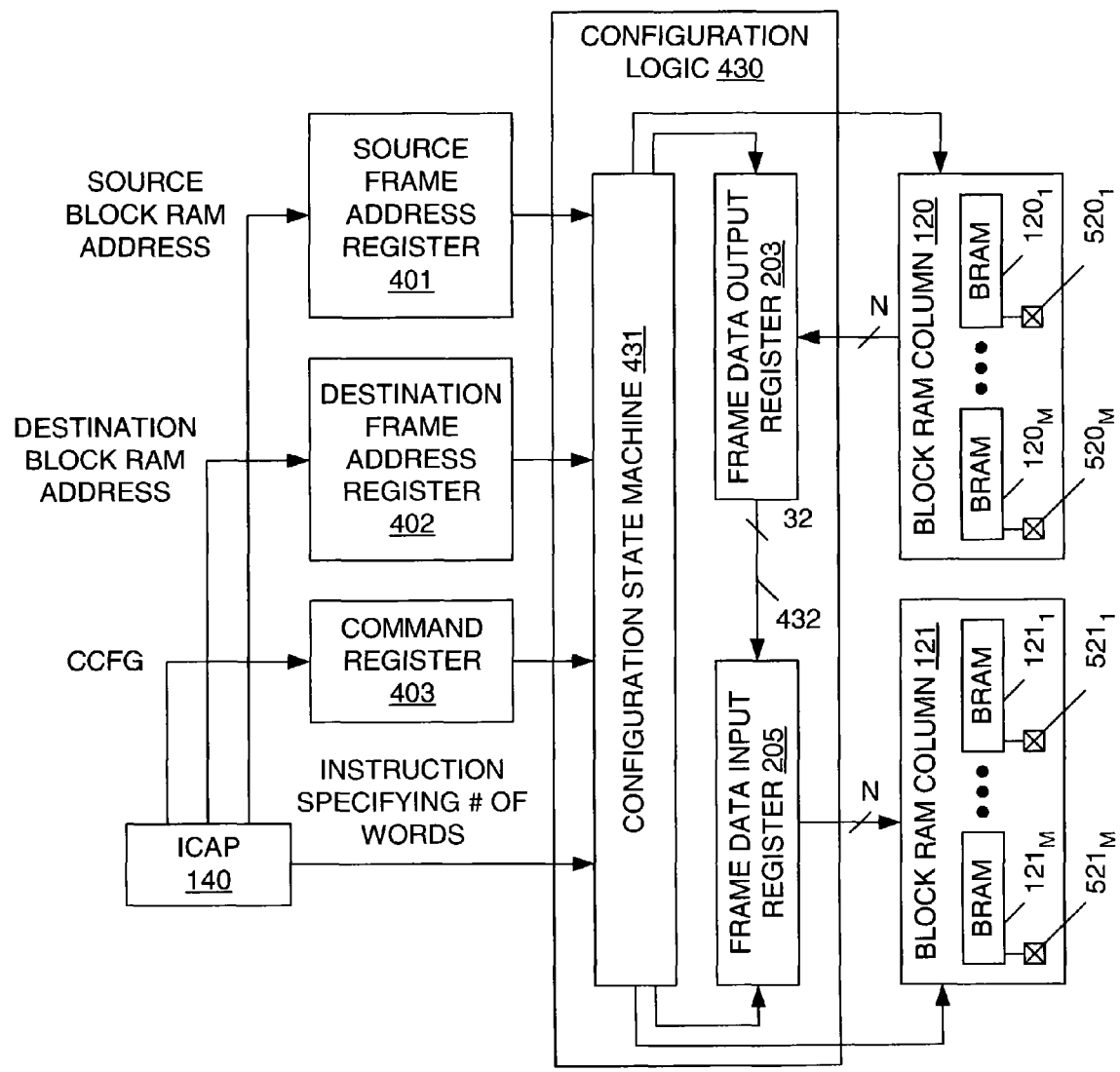
FIG. 5 is a block diagram of a data transfer system of an FPGA in accordance with another embodiment of the present invention.

FIG. 5 is a block diagram that illustrates a partial data transfer between block RAM columns 120 and 121. As illustrated in FIG. 5, block RAM column 120 includes a plurality of smaller block RAMs $120_1$–$120_M$, wherein M is an integer equal to two or greater. Similarly, block RAM column 121 includes a corresponding plurality of smaller block RAMs $121_1$–$121_m$. In a Virtex_II™ family FPGA, each of the smaller block RAMS has a capacity of 18 Kbits. In accordance with this embodiment, each of the smaller block RAMs $120_1$–$120_M$ and $121_1$–$121_M$ have associated write protect configuration bits $520_1$–$520_M$ and $521_1$–$521_M$, respectively. When a write protect configuration bit is programmed to store a logic "1" value, then the associated block RAM is not written during write operations to the corresponding block RAM column. Conversely, if a write protect configuration bit is programmed to store a logic "0" value, then the associated block RAM is written during write operations to the corresponding block RAM column.

For example, to perform a partial data transfer, such that the data stored in block RAM $120_1$ is transferred to block RAM $121_1$, but the data stored in block RAM 120M is not transferred to block RAM $121_M$, write protect configuration bit $121_1$ is programmed to a logic "0" value, and write protect configuration bit $121_M$ is programmed to a logic "1" value. The procedure described above in connection with FIG. 4 is then performed. The data from block RAM column 120 is transferred to frame data output register 203 and then to frame data input register 205 in the manner described above. The data from block RAM $120_1$ is successfully written from frame data input register 205 to block RAM $121_1$, because the write protect configuration bit $521_1$ has a logic "0" value. However, the data from block RAM $120_M$, is not successfully written from frame data input register 205 to block RAM $121_M$, because the write protection configuration bit 521 has a logic "1" value. In this manner, a partial data transfer is implemented.

Although the invention has been described in connection with several embodiments, it is understood that this invention is not limited to the embodiments disclosed, but is capable of various modifications, which would be apparent to one of ordinary skill in the art. For example, although the configuration data bus 432 has a width of 32-bits in the described embodiments, it is understood that this bus can have other widths in other embodiments. Thus, the invention is limited only by the following claims.

I claim:

1. A method of transferring data using a field programmable gate array (FPGA), the method comprising:
   retrieving a first set of data from a first section of a configuration memory of the FPGA;
   storing the first set of data retrieved from the first section of the configuration memory in a first storage element;
   transferring the first set of data from the first storage element directly to a second storage element on a configuration bus of the FPGA; and
   transferring the first set of data from the second storage element to a second section of the configuration memory of the FPGA.

2. The method of claim 1, further comprising loading the first set of data into the first section of the configuration memory on the configuration bus.

3. The method of claim 1, wherein the first set of data comprises data stored in a single column of the configuration memory.

4. The method of claim 1, wherein the step of retrieving the first set of data comprises retrieving the first set of data from the first section of the configuration memory in parallel.

5. The method of claim 4, wherein the step of transferring the first set of data from the first storage element to the second storage element comprises shifting the first set of data onto the configuration bus as a plurality of data words.

6. The method of claim 5, wherein each of the data words and the configuration bus have a width of 32-bits or greater.

7. The method of claim 1, further comprising write-protecting one or more selected regions of the second section of the configuration memory.

8. The method of claim 1, further comprising:
loading an address associated with the first section of the configuration memory into a first address register; and
loading a second address associated with the second section of the configuration memory into a second address register.

9. The method of claim 8, further comprising:
loading an instruction specifying a data transfer into a command register.

10. The method of claim 9, further comprising providing an instruction specifying the number of words in the first set of data.

11. A field programmable gate array (FPGA) comprising:
a configuration memory arranged in rows and columns;
a configuration bus configured to route data to and from the configuration memory, the configuration bus having a first width;
a source frame address register configured to store a source frame address that identifies a source section in the configuration memory;
a destination frame address register configured to store a destination frame address that identifies a destination section in the configuration memory;
a command register configured to receive a copy configuration instruction; and
configuration logic configured to transfer data from the source section to the destination section in response to the copy configuration instruction in the command register.

12. The FPGA of claim 11, wherein the configuration logic comprises a data path for routing the data from the source section to the destination section, wherein the data path has a width at least as wide as the first width.

13. The FPGA of claim 12, wherein the data path comprises the configuration bus.

14. The FPGA of claim 12, wherein the data path further comprises:
a frame data output register configured to receive data from the source section address of the configuration memory; and
a frame data input register configured to receive the data from the frame data output register via the configuration bus, and provide the data to the destination section address of the configuration memory.

15. The FPGA of claim 12, wherein the configuration logic further comprises a configuration state machine configured to control the data path in response to the source frame address, the destination frame address and the copy configuration instruction.

16. The FPGA of claim 11, further comprising a plurality of write-protect configuration memory cells coupled to the configuration memory.

17. The FPGA of claim 11, wherein the source section is a source column in the configuration memory, and wherein the destination section is a destination column in the configuration memory.

18. A field programmable gate array (FPGA) comprising:
means for retrieving a first set of data from a first section of a configuration memory of the FPGA;
means for storing the first set of data retrieved from the first section of the configuration memory;
a configuration bus configured for transferring the first set of data from the means for storing the first set of data directly to a second means for storing the first set of data; means for transferring the first set of data from the second means for storing the first set of data to a second section of the configuration memory of the FPGA; and
means for write-correcting one or more selected relations of the second section of the configuration memory.

19. The method of claim 18, wherein the first set of data comprises data stored in a single column of the configuration memory.

20. The method of claim 18, wherein the means for retrieving the first set of data comprises means for retrieving the first set of data from the first section of the configuration memory in parallel.

21. The method of claim 20, wherein the means for transferring comprises means for shifting the first set of data onto the configuration bus as a plurality of data words.

* * * * *